US008098112B2

(12) United States Patent
Simpson

(10) Patent No.: US 8,098,112 B2
(45) Date of Patent: Jan. 17, 2012

(54) IMPEDANCE TUNER SYSTEMS AND PROBES

(75) Inventor: Gary R. Simpson, Fontana, CA (US)

(73) Assignee: Maury Microwave, Inc., Ontario (CA)

( * ) Notice: Subject to any disclaimer, the term of this patent is extended or adjusted under 35 U.S.C. 154(b) by 0 days.

(21) Appl. No.: 12/897,177

(22) Filed: Oct. 4, 2010

(65) Prior Publication Data

US 2011/0115582 A1 May 19, 2011

Related U.S. Application Data

(62) Division of application No. 12/555,765, filed on Sep. 8, 2009, now Pat. No. 7,808,336.

(51) Int. Cl.
*H03H 7/38* (2006.01)

(52) U.S. Cl. ...................................... 333/17.3; 333/263

(58) Field of Classification Search ................. 333/17.3, 333/263, 33
See application file for complete search history.

(56) References Cited

U.S. PATENT DOCUMENTS 7,248,866 B1 * 7/2007 Tsironis ........................ 455/423
2006/0139130 A1 * 6/2006 Boulerne ...................... 333/263

* cited by examiner

*Primary Examiner* — Stephen Jones
(74) *Attorney, Agent, or Firm* — Larry K. Roberts

(57) ABSTRACT

An impedance tuner may include a transmission media for propagating RF signals, a reflection magnitude control device mounted in a fixed position relative to a direction of signal propagation along said transmission media, and a phase shifter to control a reflection phase. A multi-section probe for an impedance tuner system may include a plurality of probe sections and a holder structure for mechanically supporting the plurality of probe sections.

16 Claims, 10 Drawing Sheets

IMPEDANCE TUNER SYSTEMS AND PROBES

CROSS-REFERENCE TO RELATED APPLICATIONS

This application claims the benefit of U.S. Provisional Application No. 60/714,972 filed Sep. 7, 2005, U.S. application Ser. No. 11/468,433, filed Aug. 30, 2006, and is a division of U.S. application Ser. No. 12/555,765, filed Sep. 8, 2009 now U.S Pat. No. 7,808,336, the entire contents of each of these applications hereby incorporated by reference.

BACKGROUND

A slide screw tuner includes a transmission line in some media, such as coaxial, slabline, waveguide, microstrip, etc. One or more probes can move perpendicular to the center conductor. As a probe moves closer to the center conductor, the mismatch at some frequency will increase, while the mismatch decreases as the probe moves away from the center conductor. At some point, when the probe is far enough away, it has very little effect on the fields around the center conductor, so the transmission line looks nearly like a uniform line without a deliberate mismatch.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
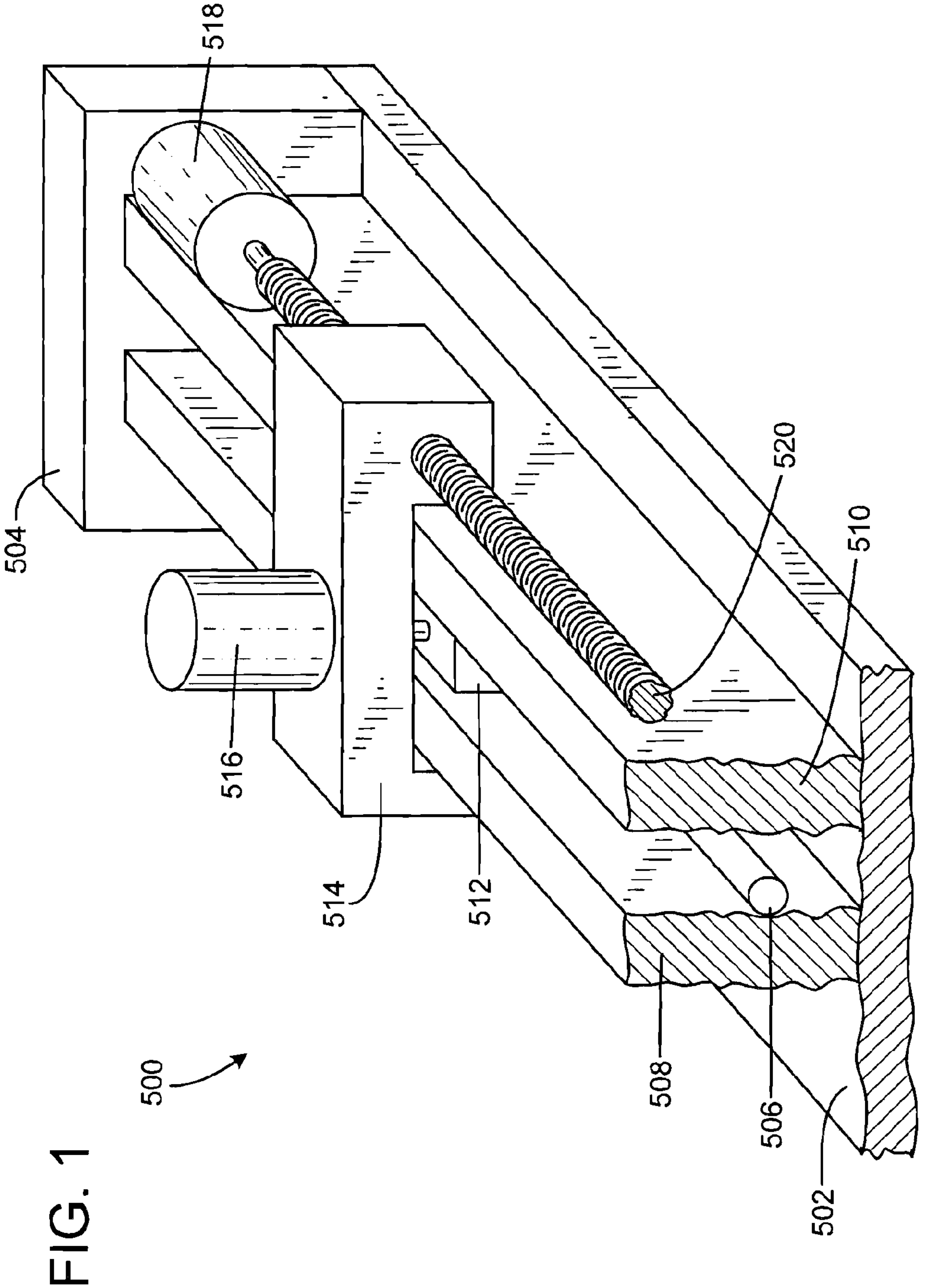
FIG. 1 is an isometric cutaway view of an automated tuner with a moving carriage.

In the following detailed description and in the several figures of the drawing, like elements are identified with like reference numerals. The figures are not to scale, and relative feature sizes may be exaggerated for illustrative purposes.

FIG. 1 schematically depicts an exemplary embodiment of an automated tuner system 500. In this embodiment, a base plate 502, an end plate 504 and ground plane slabs 508, 510 are fabricated of a metal or metalized dielectric material. A center conductor 506 is supported between the ground plane slabs 508, 510, and by a coaxial connector (not visible in FIG. 1) fitted into the end wall 504. A probe 512 is mounted on a carriage 514 for motion transverse to the center conductor axis. A motor 516 drives the probe 512 along the transverse path toward or away from the center conductor axis. The carriage is driven along a path parallel to the center conductor axis, by a leadscrew 520 driven by a carriage drive motor 518. In an exemplary embodiment, moving the carriage primarily results in changing the phase of the reflection.

Figure 2:
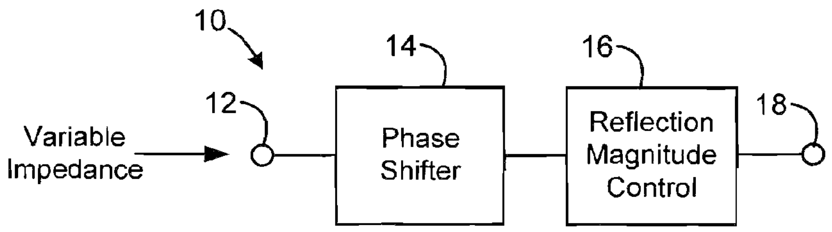
FIG. 2 schematically illustrates a technique of controlling phase of the mismatch in a tuner.

An aspect of one embodiment provides a technique of controlling phase of the mismatch in a tuner. FIG. 2 schematically illustrates this technique, in an RF circuit structure 10. Here, a variable impedance is presented at terminal 12. In one exemplary embodiment, a device under test (DUT) may be connected at node 12, and the variable impedance presented to the DUT. In some embodiments, node 18 may be terminated by a load or measuring instrument, e.g. a power meter, spectrum analyzer, network analyzer etc. . . . In this exemplary embodiment, the phase is varied with a phase shifter 14 inserted between the reflection magnitude control 16 and the DUT 20 as shown in FIG. 2. This allows the reflection magnitude control to be mounted in a fixed location in the transmission line media. For example, in FIG. 1, the probe 512 remains stationary, and a movable carriage may be omitted. In this case, a phase shifter is added, e.g. at the center conductor connector.

The phase shifter may be of any type, although the required mismatch range may put requirements on the maximum loss that can be tolerated. Examples of phase shifters include but are not limited to line stretchers, switched lines, PIN diode phase shifters, varactor diode phase shifters, MEM phase shifters and ferrite phase shifters. Typically, the phase shifter is a variable phase shifter, which may be manually controlled or under an automated control.

This approach to controlling the phase provides flexibility in the design of the reflection magnitude control, since it may be mounted in a fixed location in the transmission line. The reflection magnitude control may be a mechanical probe that moves perpendicular to the transmission media (the center conductor in a TEM line) or it may be a solid state reflection magnitude control, such as a PIN diode or varactor circuit.

Figure 3:
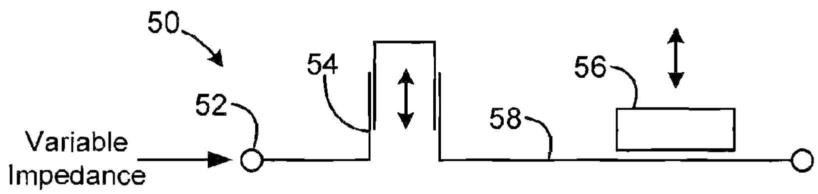
FIG. 3 is a simplified schematic block diagram of an impedance tuner.

An exemplary embodiment of an impedance tuner 50 is schematically illustrated in FIG. 3. A mechanical line stretcher 54 is used as the phase shifter, and a mechanical probe 56 is mounted in a slab line transmission line 58. In this exemplary embodiment, the line stretcher 54 is mounted in the same slab transmission line as the reflection control or mismatch element 56, although they could also be mounted in separate units, and connected with external connectors. Either or both the line stretcher 54 or mismatch probe 56 may be controlled manually or automated to move the line stretcher along its axis and the probe along its axis.

Figure 4:
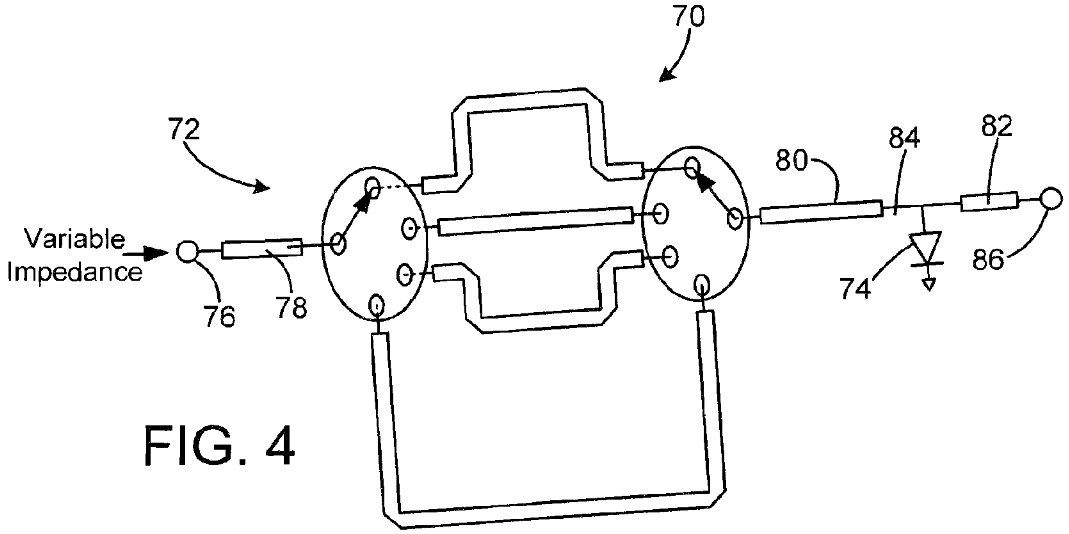
FIG. 4 is a simplified schematic block diagram of an alternate embodiment of an impedance tuner.

Another exemplary embodiment of an impedance tuner 70 is shown schematically in FIG. 4. In this exemplary embodiment, a switched line phase shifter 72 is used for the phase shifter, and a shunt PIN diode 74 is used as a solid state impedance mismatch element. A DC bias current may be applied by a bias circuit (not shown in FIG. 4). A transmission line 78 connects input terminal 76, at which a variable impedance may be presented, to the phase shifter. Another transmission line section 80 connects the output of the phase shifter to a circuit node 84 at which the diode is connected. Another transmission line section 82 is connected between the node 84 and the output terminal 86. With no DC bias current through the diode 74, the impedance mismatch is low. As the DC current is increased, the mismatch increases until the diode shorts the center conductor of the transmission line sections 80, 82 to ground for a very high mismatch. The phase of the mismatch is varied with the phase shifter. In this exemplary embodiment, the entire circuit may be implemented in one microstrip circuit, but the phase shifter and mismatch element may alternatively also have been packaged in separate housings. In this example, automated electronic control of the switching and diode mismatch may be used, although it could also be set up for manual control.

When a probe such as probe 512 (FIG. 1) or probe 56 (FIG. 3) is used for reflection magnitude control, then the mismatch varies from zero to maximum as the mechanical probe is moved toward the center conductor. The range from zero to the maximum mismatch value is also called the matching range. Increasing the maximum mismatch value also increases the matching range.

In an exemplary embodiment, the probe may have multiple sections. In principle, it can be any number of sections, and, in an exemplary embodiment, designed using filter design techniques to obtain an increased matching range and a specific bandwidth for a particular application.

An exemplary design approach for a multi-section probe is to use an even number of mismatch sections that alternate with gaps. In a gap between any two sections, the transmission line will look nearly like the transmission line without a mismatch probe, and the lengths of the mismatch sections and gaps are selected to give the desired mismatch response vs. frequency. In this exemplary design approach, the impedance of all sections may be variable as the probe is moved perpendicular to the center conductor. All sections may have approximately the same cross section and move together so that for any given position, they are all approximately at the same distance from the center conductor. Therefore, for any given position the characteristic impedance of all sections will be approximately the same. Note that assuming that all the sections are identical is useful for analysis, but not required in practice. Only minor effects are likely to occur due to some deviation due to manufacturing tolerances or the accuracy of the mechanics that move the probe relative to the center conductor.

In an exemplary design approach, a design criteria may be to select a cross section of the probe that gives a good matching range, and to select the lengths of the mismatch sections and gaps. The cross section of the probe may be (although is not limited to) the same as used in single-section probes.

Figure 5:
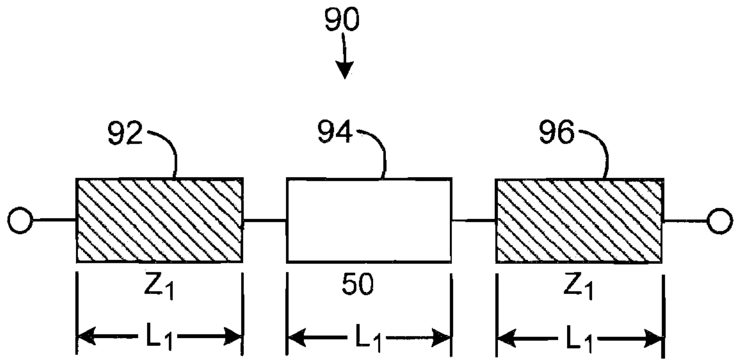
FIG. 5 is a schematic diagram of a 2-section probe with a single gap.

In exemplary embodiments of a design approach, the lengths of the sections and gaps for ideal transmission line sections for probes of different numbers of sections are as follows:

For a 2-section probe, the length of each section and the one gap may all be equal. FIG. 5 is a schematic diagram of a 2-section probe 90 with a single gap. In this embodiment, each probe section 92 and 96 has a characteristic impedance $Z_1$ and a length $L_1$. The gap 94 has a length $L_1$ and a characteristic impedance equal to the base characteristic impedance of the transmission line with the probe removed, e.g. in one embodiment, 50 ohms. The characteristic impedance of the probe sections is variable as the probe moves closer to or further away from the center conductor.

Figure 6:
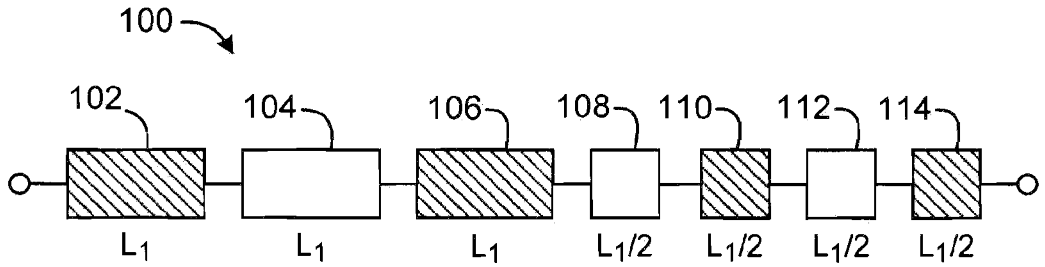
FIG. 6 is a schematic diagram of an exemplary embodiment of a 4-section probe.

FIG. 6 is a schematic diagram of an exemplary embodiment of a 4-section probe 100. For a 4-section probe, the first two sections 102 and 106 and the first gap 104 may all be equal in length $L_1$. The next two sections 110, 114 and two gaps 108, 112 may all be one-half of the length of the prior two sections, i.e. $L_1/2$. Each probe section has a characteristic impedance $Z_1$ which is variable as the probe is moved closer to or further from the center conductor. Each gap 104, 108, 112 has a characteristic impedance of 50 ohms.

Figure 7:
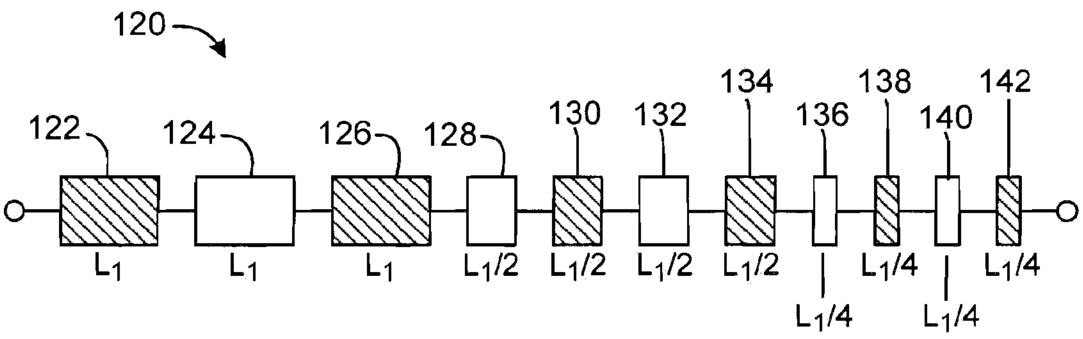
FIG. 7 is a schematic diagram of a 6-section probe.

FIG. 7 is a schematic diagram of a 6-section probe 120. For a 6-section probe, the first two sections 122, 126 and the first gap 124 should all be equal in length, with length $L_1$. The next two sections 130, 134 and two gaps 128, 132 may all be one-half of the length of the prior two sections, i.e. $L_1/2$. The third pair of sections 138, 142 and two gaps 136, 140 should also all be one-half of the length of the prior two sections, i.e. $L_1/4$.

In an exemplary embodiment of a design approach, additional sections may be added in pairs with also a pair of gaps, and each time a pair is added, each section length and gap length will be one-half the length of the prior pair of sections. Note that this halving of lengths each time two sections are added is for the ideal transmission line case. In practice, the physical lengths may be adjusted to account for end effects and other physical transmission line effects for the specific transmission media that is used.

Figure 8:
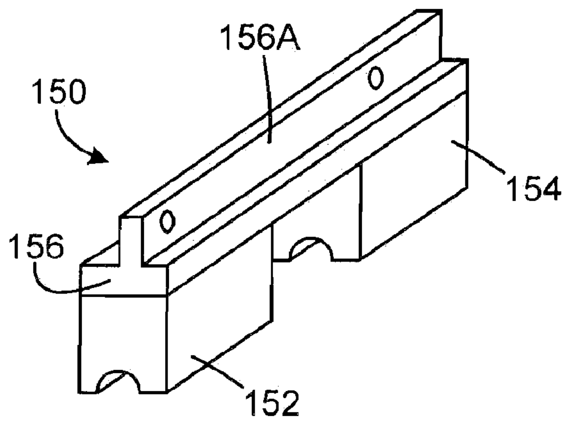
FIG. 8 schematically illustrates a 2-section probe embodiment with a dielectric holder connecting the two sections.

Some exemplary embodiments of probe designs for a slab line configuration are shown in FIGS. 8-11. FIG. 8 diagrammatically illustrates a 2-section probe embodiment 150, including probe sections 152, 154, with a dielectric holder 156 mechanically supporting the two probe sections. The dielectric holder includes a tab portion 156A for attaching the holder to a drive mechanism. The probe section/gap lengths and impedances are similar to those discussed above regarding FIG. 5.

Figure 9:
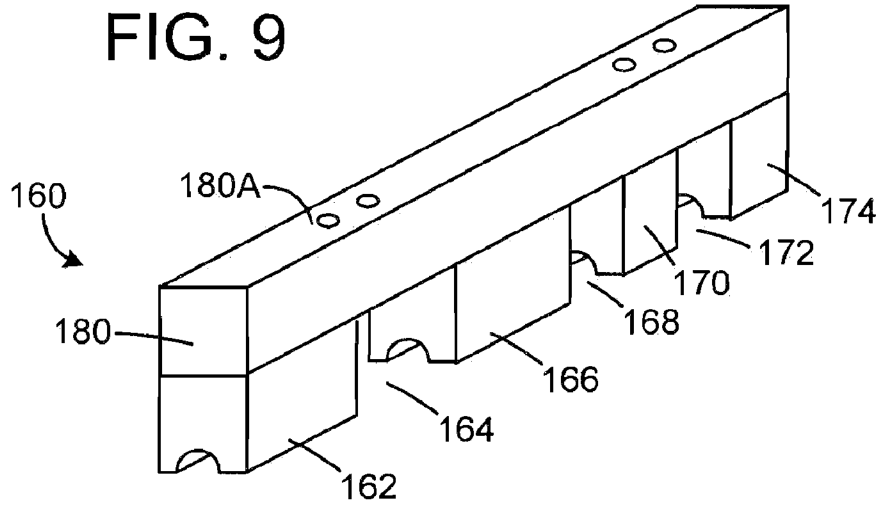
FIG. 9 is a schematic diagram of an exemplary embodiment of a 4-section probe with a dielectric holder connecting the four sections.

FIG. 9 is an isometric diagram of an exemplary embodiment of a 4-section probe 160 with a dielectric holder 180 connecting the four sections 162, 166, 170 and 174. Gaps 164, 168, and 172 separate the four probe sections. The probe section/gap lengths and impedances are similar to those discussed above regarding FIG. 6. The sections are mounted to a dielectric holder 180 in such a way as to define the gaps between them. Holes 180A are formed in the holder 180 for attaching the holder to a drive mechanism.

Figure 10:
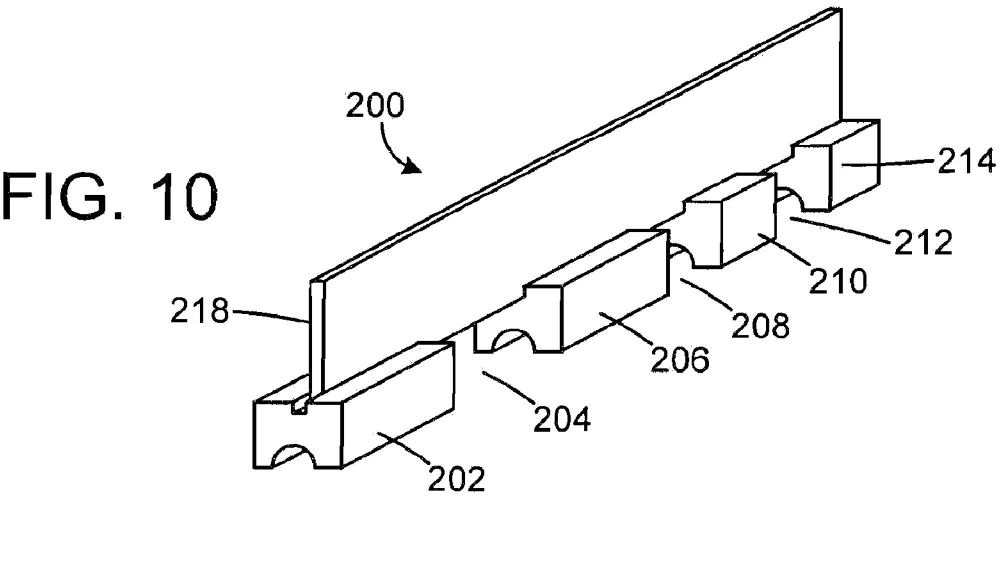
FIG. 10 is a schematic diagram of a 4-section probe with a thin holder connecting the four sections.

FIG. 10 is an isometric of an exemplary embodiment of a 4-section probe 200 with a thin holder 218 connecting the four probe sections 202, 206, 210, 214. The probe section/gap lengths and impedances are similar to those discussed above regarding FIG. 6. In this case the holder may be dielectric or metal. The thickness of the holder is thinner than the probes, so that the fields to ground will mostly be from the probe sections to the slab line walls. In the case of a thin metal holder structure, the probe and holder may be fabricated as a unitary structure.

Figure 11:
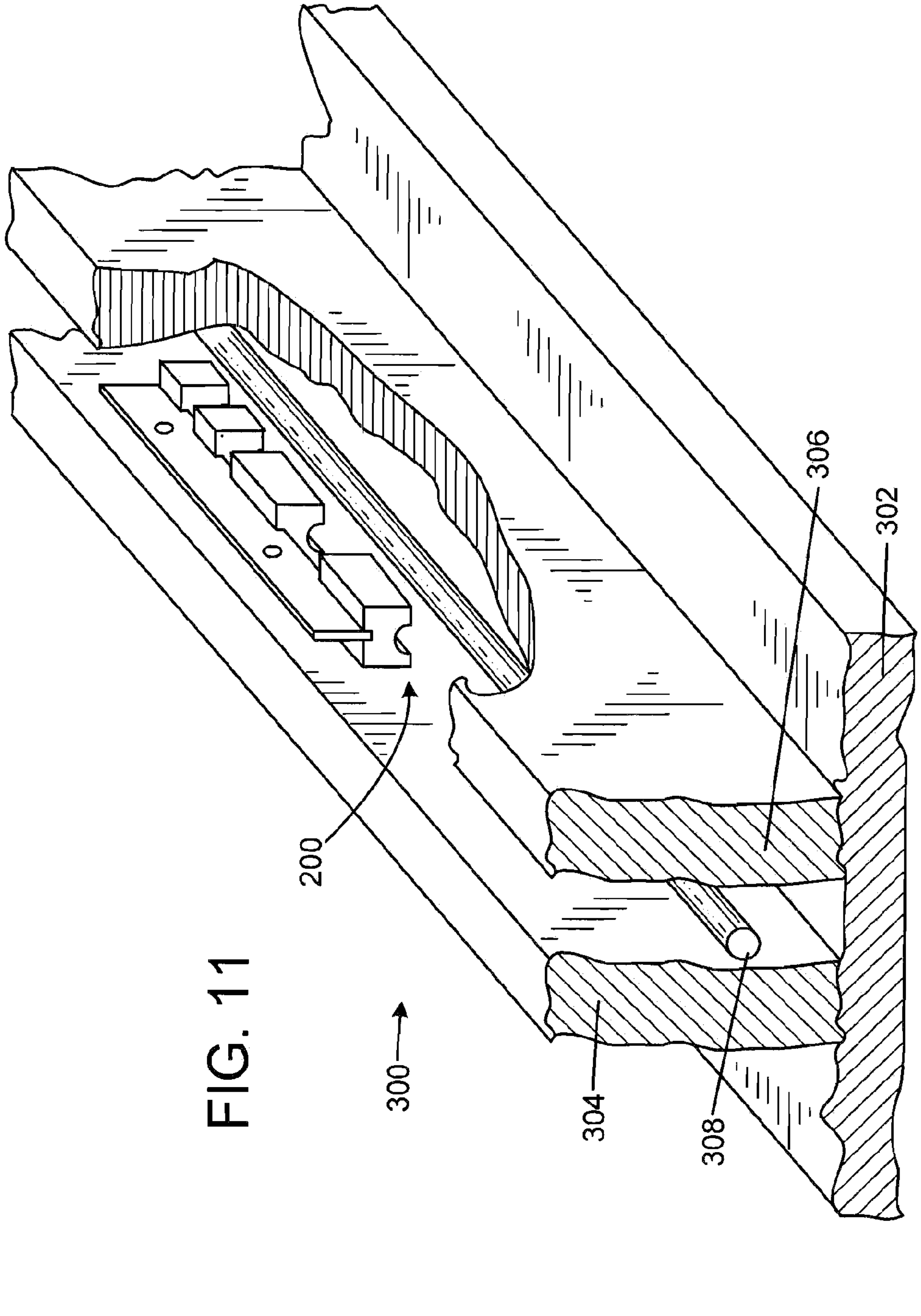
FIG. 11 illustrates the 4-section probe of FIG. 10 in the context of an exemplary slab line transmission line.

FIG. 11 illustrates the 4-section probe of FIG. 10 in the context of a slab line transmission line 300. Here, the line 300 includes a base plate 302 and separated parallel ground plane slabs 304, 306 mounted transversely on the top of the base plate. A center conductor 308 is supported between the ground plane slabs 304, 306. The probe structure 200 may be mounted for movement along the center conductor, and also transversely to the center conductor, as illustrated with respect to FIG. 1.

A multi-section probe may be mounted on a carriage as depicted in FIG. 1, and the whole probe moved along the center conductor to control the phase.

This disclosure is not limited to dielectric holders to support multiple probe sections. Dielectric holders may work best when the probes are intended to be non-contacting with the ground slabs. However, if the probes are designed to make direct electrical contact with the ground slabs, then the supporting holder may be made out of any material, including metal, because the electromagnetic fields will not penetrate significantly to the holder area. In this case, any number of sections could even be made out of one piece of metal. One embodiment of this would be to slot the probes from the underside (directly above the center conductor). The slot may be compressed when the probes are inserted in between the slabs, providing spring action side to side against both slabs.

Another approach to the multi-section probe design may use sections which may be either higher or lower impedance than the characteristic impedance of the basic transmission line media. This provides freedom in the tuner design, and more traditional filter approaches may be used.

Figure 12:
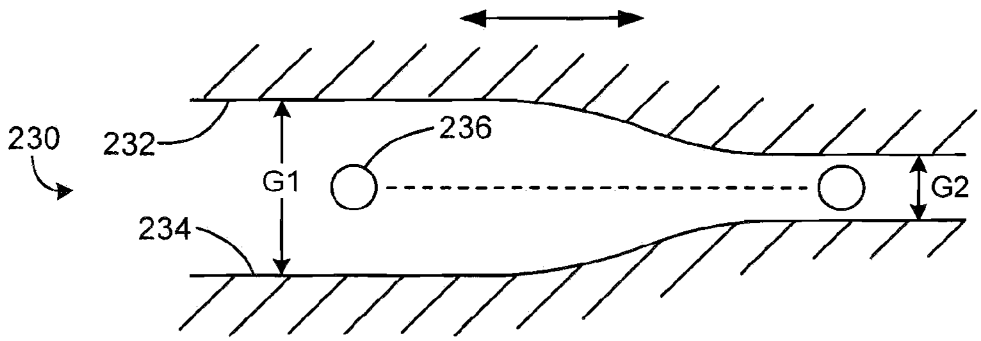
FIG. 12 diagrammatically illustrates a cross section of a moving ground plane that will change the line impedance as the ground plane moves.

An exemplary embodiment of an impedance tuner design with transmission line sections that may be either higher or lower impedance than the basic transmission line may use a moving ground plane. Electrically, this is equivalent to moving a probe closer to the center conductor, but in this case, the center conductor is fixed and the ground plane moves. FIG. 12 diagrammatically illustrates a cross section of a moving ground plane structure 230 that will change the line impedance as the ground plane moves relative to a fixed center conductor 236. The gap between the opposed ground planes 232 and 234 tapers from a larger gap G1 to a smaller gap G2 just slightly larger than the diameter of the center conductor. The line impedance with the ground plane structure positioned such that the center conductor 236 is in the larger gap is $Z_0$ (or higher), and with the ground plane structure positioned such that the center conductor is positioned at the smaller gap G2 is a lower impedance.

Figure 13:
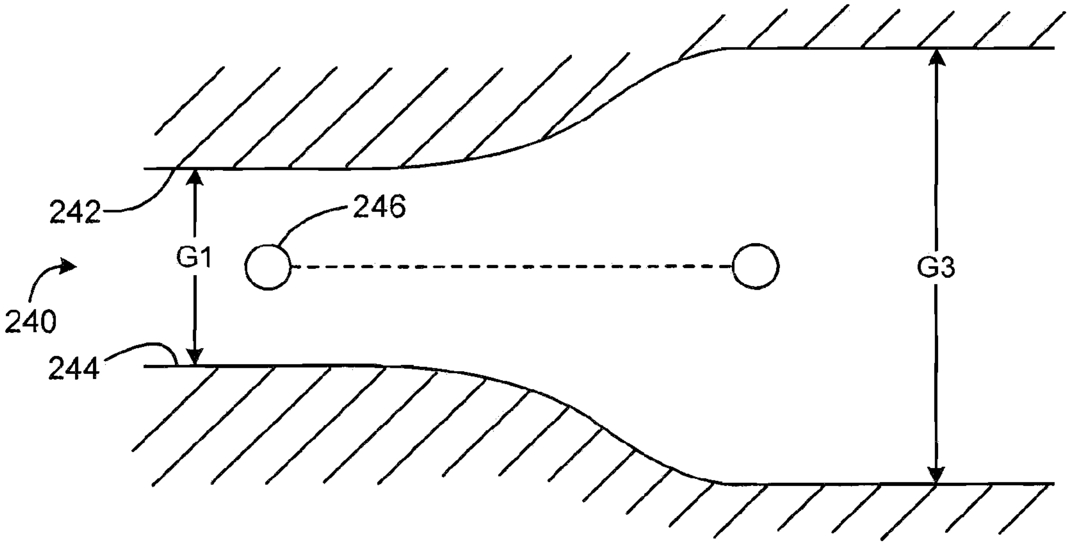
FIG. 13 shows a similar cross section, but moves the impedance in the opposite direction of the moving ground plane embodiment of FIG. 12.

FIG. 13 shows a cross section similar to that of FIG. 12, but moves the impedance in the opposite direction of the moving ground plane embodiment of FIG. 12. Here, the gap between the ground planes 242, 244 is tapered between the gap size G1 and a larger size G3. In this case the line impedance with the ground plane structure 240 positioned with the center conductor at G1 is at $Z_0$ (or lower), and increases to a higher impedance with the ground plane structure positioned with the center conductor 246 at G3. If sections are made from both embodiments of FIGS. 12-13, then some sections may be increasing impedance at the same time that other sections are decreasing impedance. This provides design freedom. This also allows traditional filter design approaches to be used, since they often require both high and low impedance sections.

In the exemplary example of the moving ground plane, multiple sections may be cascaded. At one end of the motion, all sections may be set to the characteristic impedance of the basic transmission line ($Z_0$), so there the reflection magnitude is small. At the other end of the motion, some or all of the sections may be different in impedance, either higher or lower, to create the maximum mismatch. A filter design approach may be used to design the line impedances for the maximum mismatch position. The same design approach could also be used at intermediate positions to control how the overall reflection varies with position.

In FIGS. 12 and 13, the ground planes are shown open on both ends, but that is not necessary. There may be many possible advantages to closing the ends, depending on the overall tuner configuration.

Figure 14:
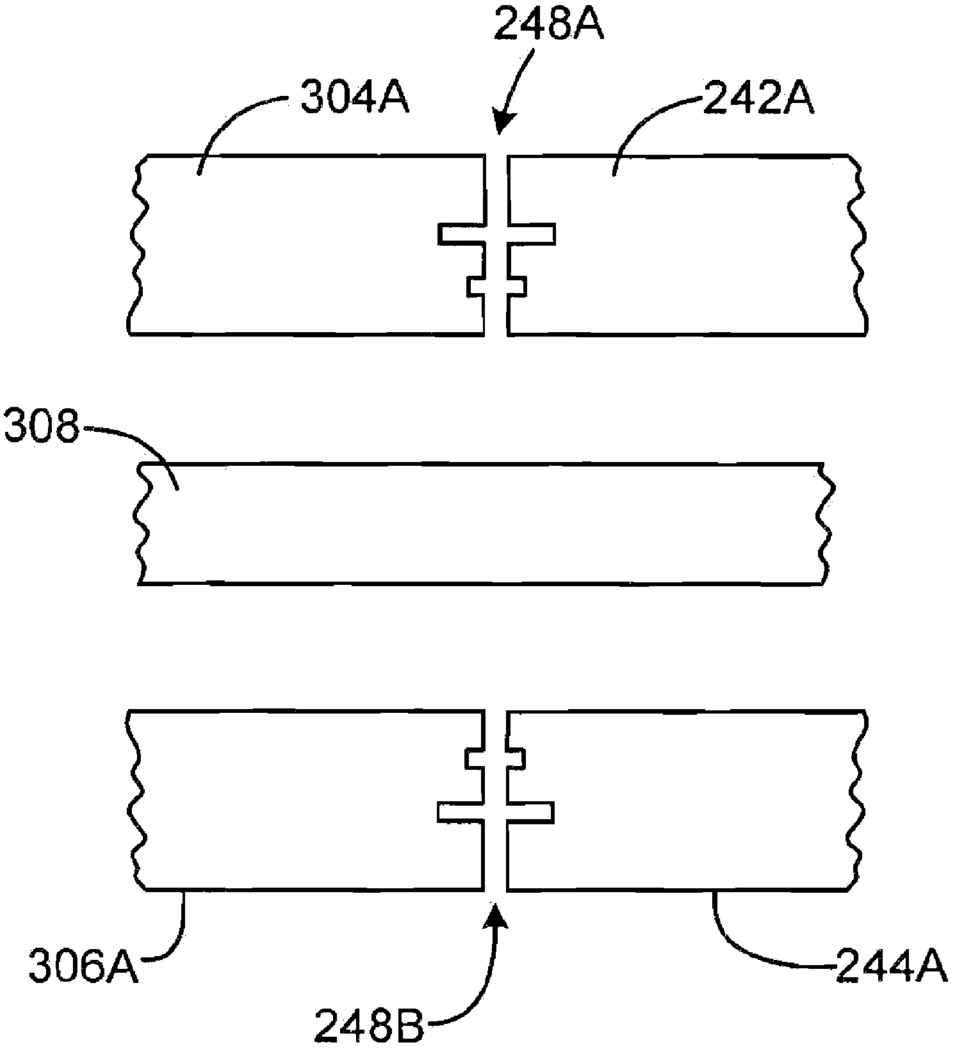
FIG. 14 illustrates an embodiment with fixed and movable ground planes.

An exemplary embodiment of a tuner using a moving ground plane may be similar to the embodiment of FIG. 1, with fixed ground plane slabs at each end with a center conductor fixed between the ends, but the center part of the ground plane slabs are different. In the center, the fixed ground plane slabs may be cut away, and replaced with movable ground plane slabs. The movable slabs may include one or more sections. An exemplary embodiment is shown in FIG. 14, in which fixed slab sections 304A, 306A are positioned on opposite sides of a center conductor 308. Movable slab sections 242A and 244A are positioned with non-contacting joints 248A, 248B adjacent to the fixed slab sections. One embodiment is to use multiple sections similar to the embodiments of FIGS. 12 and 13, where the sections of each of the two slabs are either bolted together or machined out of one piece. The two slabs 242A, 244A then may be mechanically moved up and down. At one end of motion, all of the sections give a ground plane separation from the center conductor that is the same as the basic transmission line in the areas with fixed slabs 304A, 306A at each end of the tuner. At the opposite end of motion, each section of the movable slabs 242A, 244A gives a ground plane separation to produce a specific desired characteristic impedance for that section. The desired impedance of each section may be determined during the design process so that collectively, the sections together produce a desired reflection vs. frequency.

If a moving ground plane configuration is used, a choke section may be used to help ensure a robust and stable ground plane connection to the fixed ground plane of the main housing, as shown in FIG. 14. The choke section or sections will help make good ground plane continuity without requiring a good physical contact. This provides good, stable performance with low mechanical friction.

Normally, if there is a gap in the ground plane, energy may propagate into and even out through the gap, causing losses and/or sensitivities to the environment outside the ground plane. It may also cause resonances at some frequencies based on the construction geometries. A choke section may comprise a slot cut into the ground plane parallel to the gap to reduce propagation of energy past the slot, reflecting it back out of the gap as if there was a direct connection at that point. A choke section may not reflect all the energy, and may work only over a limited bandwidth, so multiple choke sections may be used to obtain better performance or broader bandwidth.

Figure 15:
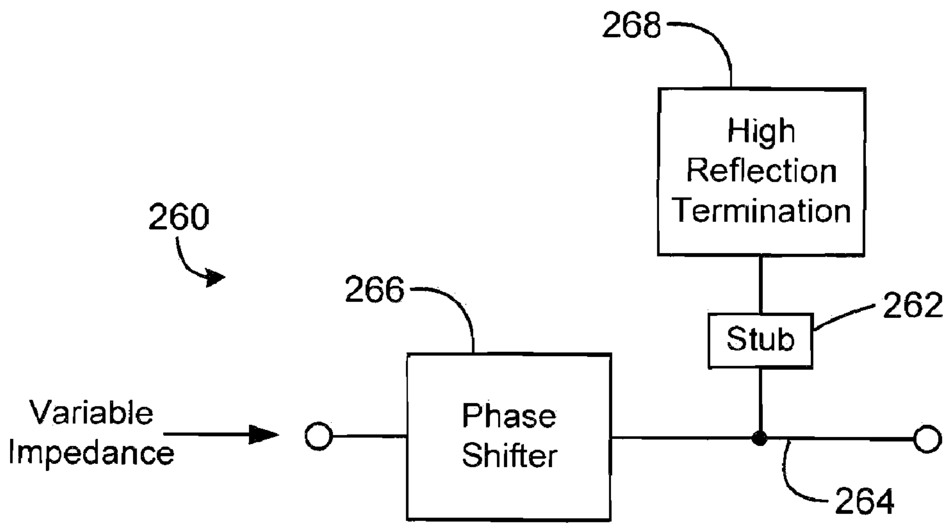
FIG. 15 is a schematic diagram of a tuner with a high reflection and variable phase.

In a further aspect, a tunable reflection, e.g., a very high reflection magnitude, may be created at a desired frequency. This might typically be at a harmonic frequency, but is not limited to that. If tuning adjustment is included, it will vary the frequency of the high reflection. An exemplary embodiment of this type of reflection control is shown schematically in FIG. 15 as system 260. A shunt stub 262 is connected to the main transmission line 264 at a fixed location. The stub may be an open stub, a shorted stub, or a stub terminated with any other high reflection 268. A phase shifter 266 in front of the stub allows the phase of the high reflection to be varied. This is useful, for example, for impedance tuning at a harmonic frequency where the application requires a high reflection but at a variable phase. An advantage of this approach is that the fixed location allows a good, low-loss connection that will be stable over time.

Figure 16:
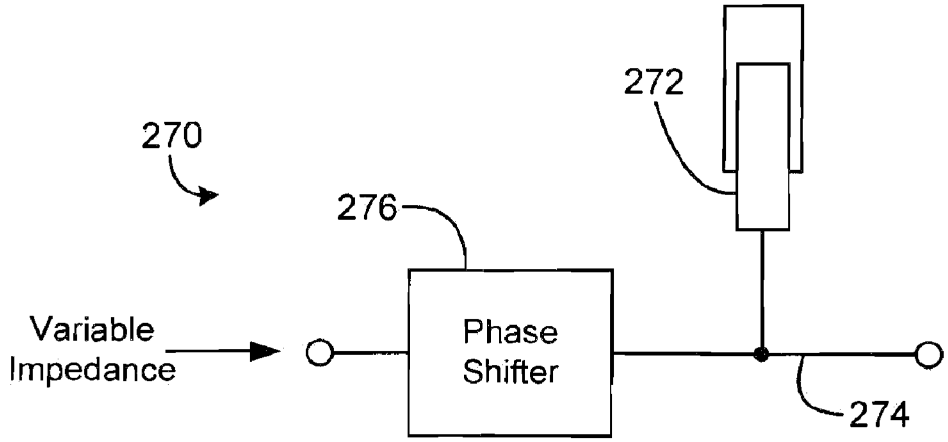
FIG. 16 is a schematic diagram of a tuner with high reflection and variable phase, wherein a frequency of the high reflection may be varied.

Another exemplary embodiment may use a stub 272 with a tunable length, connected to the main transmission line 274, as shown in the system 270 of FIG. 16. This allows the frequency of the high reflection to be varied. This allows operation over a range of frequencies. A phase shifter 276 in front of the stub allows the phase of the high reflection to be varied.

An alternate approach is to use a shunt transmission line stub with adjustable length, terminated with a high reflection of arbitrary phase other than an open or a short that can move along the line with a movable connection. The phase may be varied by moving the shunt line along the main transmission line, eliminating the need for a phase shifter in front of the shunt line.

Some transmission line media, such as waveguide, do not have center conductors. In that case, the probe moves into the electromagnetic fields in such a way to cause a mismatch on the transmission line. The concept is the same as for transmission line media with center conductors. Therefore, even though exemplary embodiments described above have employed media with center conductors as examples, the principle is general and applies to all media types.

A schematic diagram of an exemplary embodiment of a tuner system 400 utilizing several of the elements described above is shown in FIG. 17. A phase shifter (line stretcher) 54 as described above regarding FIG. 3 is connected between the DUT port 402 and an adjustable length shunt stub 272 as described above regarding FIG. 16. A probe 200 as described above regarding FIG. 10 is mounted in a slabline comprising a center conductor 506 similar to that illustrated in FIG. 1, and connected to the shunt stub 272. In combination, these provide independent tuning at a fundamental frequency and the second harmonic frequency. The probe may be made of any number of sections, including only one section.

Figure 17:
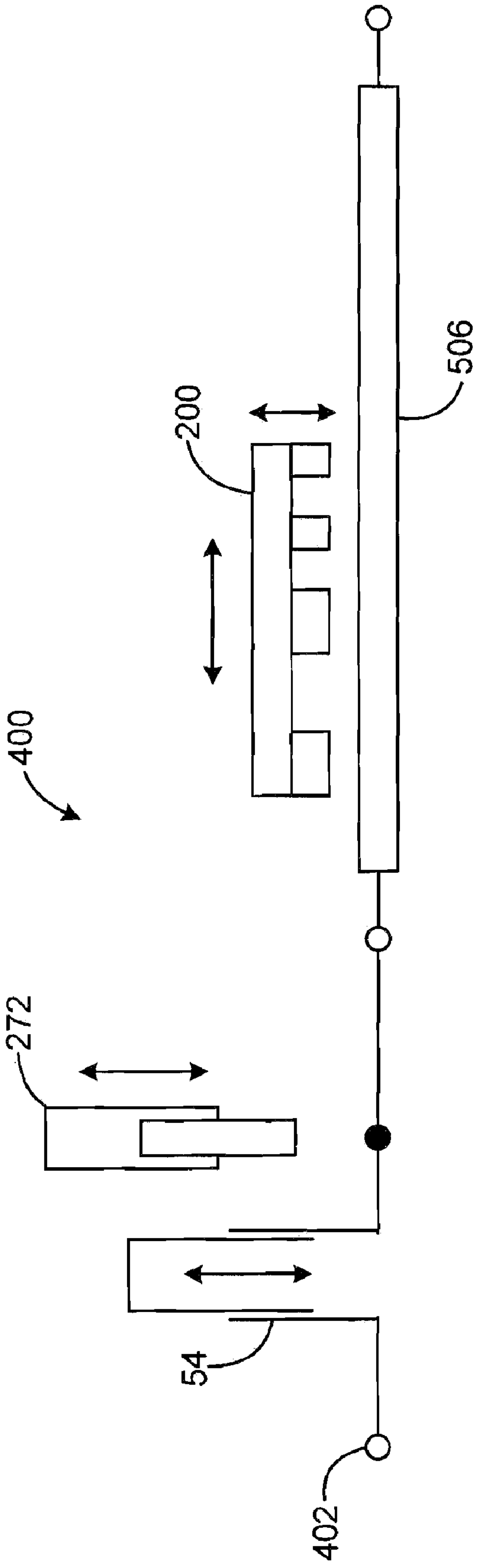
FIG. 17 is a schematic diagram of an alternate embodiment of a tuner system.

The operation of the tuner system of FIG. 17 is as follows: First, the length of the shunt stub 272 is adjusted to give maximum reflection at the second harmonic frequency and low reflection at the fundamental frequency, as seen at the DUT port 402. Second, the length of the line stretcher 54 is adjusted to give the desired phase at the second harmonic frequency as seen at the DUT port. Third, the probe 200 is moved to set the impedance at the fundamental frequency at the DUT port 402, compensating for the new positions of the shunt stub 272 and line stretcher 54. The probe 200 is moved transverse to the center conductor 506 to control magnitude (primarily) at the fundamental frequency and the probe carriage is moved along the line to control phase (primarily) at the fundamental frequency.

The tuner system 400 of FIG. 17 could be modified in many ways. One variation is to add another line stretcher and adjustable length shunt stub, similar to that shown in FIG. 16, in front of the existing set at the DUT port 402. This would enable tuning at the fundamental and two harmonic frequencies. Other variations could be made by substituting any combination of the tuning elements already described with each other or with conventional tuners.

An exemplary embodiment of applying the tuners described above is for load pull measurements. In general, load pull is any application where a Device Under Test (DUT) will be measured while the impedance presented to it on any DUT port may be varied ("pulled"). This includes both power and noise parameter measurements.

Figure 18:
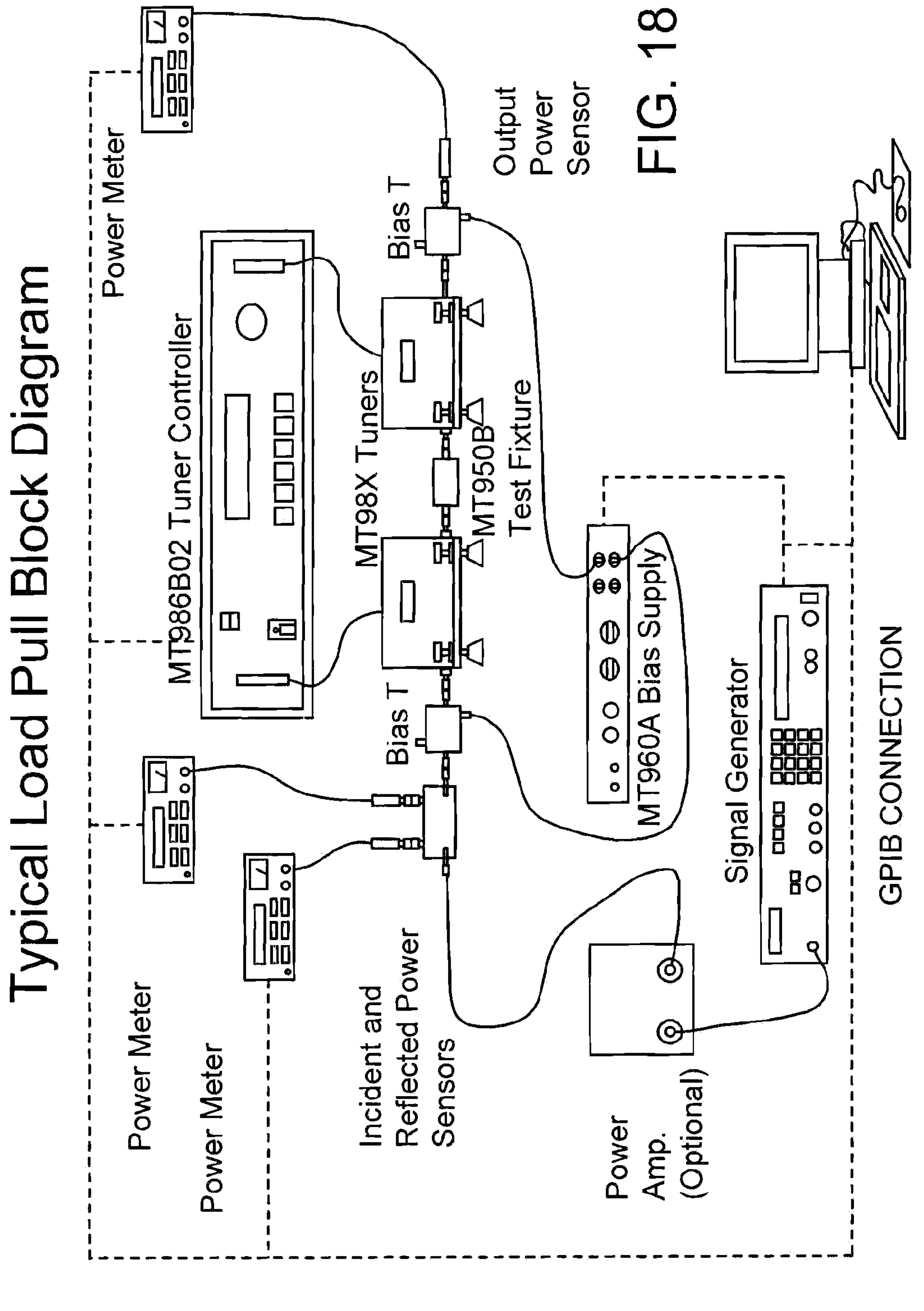
FIG. 18 illustrates an exemplary load pull block diagram.

FIG. 18 illustrates an exemplary load pull block diagram. In the example of FIG. 18, the DUT may be a microwave transistor mounted in the MT950B Test Fixture, marketed by Maury Microwave Corporation, with the input on the left side of the fixture and the output on the right side of the fixture. A tuner (labeled MT98X, one of the tuners available from Maury Microwave Corporation) is then connected on both the input and output, so that the impedances may be controlled at both measurement planes. DC bias is applied to the DUT with a bias supply and a signal generator provides an input signal at the desired measurement frequency. Three power meters are then used to measure incident power, reflected power, and output power of the DUT. The basic measurements are then de-embedded to the DUT input and output planes to show the performance of the DUT alone. The de-embedding is done using data describing the system components that is determined in an earlier calibration step. In this example, all of the measurement equipment, including the tuners, is controlled by software on a computer connected to the load pull system through a GPIB connection.

A wide variety of instrumentation is available to include in a load pull system, depending on what aspect of DUT performance is to be measured. FIG. 18 is only an example of one basic load pull setup.

The DUT performance typically depends on the impedances seen by the DUT at the input and output, so the tuners play the important role of creating the desired impedance at each plane.

Among the aspects of embodiments of the disclosure are the following:

- An impedance tuner with a reflection magnitude control in a fixed position and using a phase shifter to control the reflection phase.
- An impedance tuner with a reflection magnitude control in a fixed position and using a phase shifter to control the reflection phase used in a load pull application.
- An automated impedance tuner with a reflection magnitude control in a fixed position and using a phase shifter to control the reflection phase.
- An impedance tuner using a line stretcher for phase control and with a reflection magnitude control in a fixed position.
- A multi-section probe (more than 1 section) with a dielectric structure that supports the sections mechanically.
- A multi-section probe (more than 1 section) with a thin holder of either dielectric or metal that supports the sections mechanically.
- A multi-section probe with more than 2 sections.
- A multi-section probe with more than 2 sections, with a dielectric structure that supports the sections mechanically.
- A multi-section probe with more than 2 sections, with a thin holder of either dielectric or metal that supports the sections mechanically.
- The design procedure explained above as an exemplary design procedure for any multi-section probe (more than 1 section).
- The design procedure explained above as an exemplary design procedure for any multi-section probe with more than 2 sections.
- An impedance tuner that varies impedance by moving sections of the ground plane.
- An adjustable impedance tuner that uses impedance(s) higher than the basic line impedance.
- A multi-section impedance tuner that uses line sections with impedances higher than the basic line impedance.
- A multi-section adjustable impedance tuner that uses line sections, with some impedances higher than the basic line impedance, and some impedances lower than the basic line impedance.
- An impedance tuner that creates a very high reflection at a specified frequency using any shunt stub at a fixed location, and a phase shifter of any type to control the reflection phase.

An impedance tuner that creates a very high reflection at a specified frequency using any shunt stub with variable length at a fixed location, and a phase shifter of any type to control the reflection phase. The variable length of the shunt stub provides frequency tuning of the high reflection. The phase and frequency control may be manual or automated.

Although the foregoing has been a description and illustration of specific embodiments of the invention, various modifications and changes thereto can be made by persons skilled in the art without departing from the scope and spirit of the invention.

What is claimed is:

1. An impedance tuner, comprising:

a transmission media for propagating RF signals;

a reflection magnitude control device mounted in a fixed position relative to a direction of signal propagation along said transmission media; and a phase shifter to control a reflection phase.

2. The impedance tuner of claim 1, wherein the reflection magnitude control device includes a mechanical probe arranged for movement transverse to said direction of signal propagation.

3. The tuner of claim 1, wherein the reflection magnitude control device comprises a solid state reflection control device.

4. The tuner of claim 1, wherein the reflection magnitude control device comprises a moving ground plane structure arranged for movement relative to a fixed conductor of the transmission media.

5. The tuner of claim 1, wherein said transmission media is selected from the group consisting of coaxial line, microstrip line, slabline, stripline and waveguide.

6. The impedance tuner of claim 1, wherein the phase shifter is a device selected from the group consisting of line stretcher phase shifters, switched line phase shifters, PIN diode phase shifters, varactor diode phase shifters, and ferrite phase shifters.

7. A load pull measurement system, comprising the impedance tuner of claim 1.

8. The impedance tuner of claim 1, comprising an automated actuator controlled by an electronic controller to adjust the reflection magnitude control device.

9. The impedance tuner of claim 8, wherein the phase shifter is a variable phase shifter responsive to control signals from the electronic controller to set the phase shifter value.

10. An impedance tuner system, comprising:

a transmission media for propagating RF signals;

a probe system mounted in a fixed position relative to a direction of signal propagation along said transmission media;

a phase shifter to control a reflection phase; and wherein the probe system includes:

a plurality of probe sections;

a holder structure for mechanically supporting the plurality of probe sections; and a mechanism to move the plurality of probe sections and the holder structure in a direction transverse to the direction of signal propagation.

11. The tuner system of claim 10, wherein said probe sections have approximately same cross section and are movable together in a direction transverse to the direction of signal propagation so that for any given position, said probe sections are all approximately at the same distance from an axis of the transmission media.

12. The tuner system of claim 10, further comprising:

a mechanism to move the plurality of probe sections and the holder structure in a direction parallel to the direction of signal propagation.

13. The tuner system of claim 10, wherein the plurality of probe sections and the holder structure are in a fixed position relative to the direction of signal propagation.

14. A load pull measurement system, comprising the tuner system of claim 10.

15. The tuner system of claim 10, wherein said plurality of probe sections comprises an even number of spaced probe mismatch sections, and adjacent sections are separated by a gap.

16. The tuner system of claim 15, wherein lengths of the probe mismatch sections and the respective gaps are selected to provide a desired mismatch response as a function of frequency.

* * * * *